(12) United States Patent
Pizzato et al.

(10) Patent No.: US 10,014,602 B2
(45) Date of Patent: Jul. 3, 2018

(54) ADAPTER FOR MOUNTING ELECTRIC UNITS

(71) Applicant: PIZZATO ELETTRICA S.R.L., Marostica (IT)

(72) Inventors: Marco Pizzato, Marostica (IT); Simone Zonta, Bassano Del Grappa (IT)

(73) Assignee: PIZZATO ELETTRICA S.R.L., Marostica (IT)

( * ) Notice: Subject to any disclaimer, the term of this patent is extended or adjusted under 35 U.S.C. 154(b) by 0 days.

(21) Appl. No.: 15/322,112

(22) PCT Filed: Jun. 30, 2015

(86) PCT No.: PCT/IB2015/054901
§ 371 (c)(1),
(2) Date: Dec. 25, 2016

(87) PCT Pub. No.: WO2016/001832
PCT Pub. Date: Jan. 7, 2016

(65) Prior Publication Data
US 2017/0141493 A1    May 18, 2017

(30) Foreign Application Priority Data
Jun. 30, 2014 (IT) .................. VI2014A0168

(51) Int. Cl.
*H01R 9/26* (2006.01)
*H01R 25/14* (2006.01)
(Continued)

(52) U.S. Cl.
CPC ........... *H01R 9/2633* (2013.01); *H01L 33/62* (2013.01); *H01R 25/142* (2013.01); *H01R 31/065* (2013.01); *H02B 1/052* (2013.01)

(58) Field of Classification Search
CPC ...... H01H 13/04; H01H 13/023; H01H 13/14; H01R 9/2608; H01R 9/2633; H01R 25/142; H01R 31/065; H02B 1/052
See application file for complete search history.

(56) References Cited

U.S. PATENT DOCUMENTS 4,496,813 A * 1/1985 Fukushima .......... H01H 13/023
200/292
6,166,339 A * 12/2000 Bechis ................. H01H 35/143
200/61.45 R
(Continued)

*Primary Examiner* — Edwin A. Leon
*Assistant Examiner* — Oscar Jimenez
(74) *Attorney, Agent, or Firm* — Mark M. Friedman

(57) ABSTRACT

An adapter for mounting electric units to be wired to an electric system comprises a hollow anchoring body (10) having an upper portion (17) with a hole (12) for the passage of a driving control (6), a lower portion (16) removably coupled with the upper portion (17), a pair of reciprocally opposite side faces (15) at least partially open to allow the wires to access to electric units (2) housed into the anchoring body (10), means (14) for removably mounting the anchoring body (10) to a support (R), first holding means (27) adapted to removably fix the electric unit (2) to the bottom wall (13) of the lower portion (16). The first holding means (27) comprise at least one first and one second recesses (29) formed in the bottom wall (13) at respective open side faces (15) to house and snap-hold the electric unit (2).

10 Claims, 6 Drawing Sheets

(51) Int. Cl.
*H01R 31/06* (2006.01)
*H01L 33/62* (2010.01)
*H02B 1/052* (2006.01)

(56) References Cited

U.S. PATENT DOCUMENTS

| | | | | |
|---|---|---|---|---|
| 6,431,909 | B1* | 8/2002 | Nolden | H01R 9/2608 |
| | | | | 361/735 |
| 7,336,497 | B2* | 2/2008 | Eusterholz | H01R 9/2625 |
| | | | | 361/725 |
| 7,658,653 | B2* | 2/2010 | Diekmann | H01H 85/2045 |
| | | | | 439/715 |
| 8,188,398 | B2* | 5/2012 | Chu | H01H 13/023 |
| | | | | 200/312 |
| 8,986,021 | B2* | 3/2015 | Keswani | H01R 25/142 |
| | | | | 439/110 |
| 9,437,377 | B2* | 9/2016 | Ura | H01H 13/023 |
| 2005/0263380 | A1* | 12/2005 | Bouvier | H01H 13/023 |
| | | | | 200/310 |
| 2010/0240326 | A1* | 9/2010 | Balcon | H02B 1/044 |
| | | | | 455/90.3 |
| 2015/0136576 | A1* | 5/2015 | Chu | H02B 1/26 |
| | | | | 200/5 A |
| 2015/0235786 | A1* | 8/2015 | Sugihara | H01H 13/023 |
| | | | | 200/314 |
| 2016/0189889 | A1* | 6/2016 | Pizzato | H01H 3/022 |
| | | | | 200/296 |

* cited by examiner

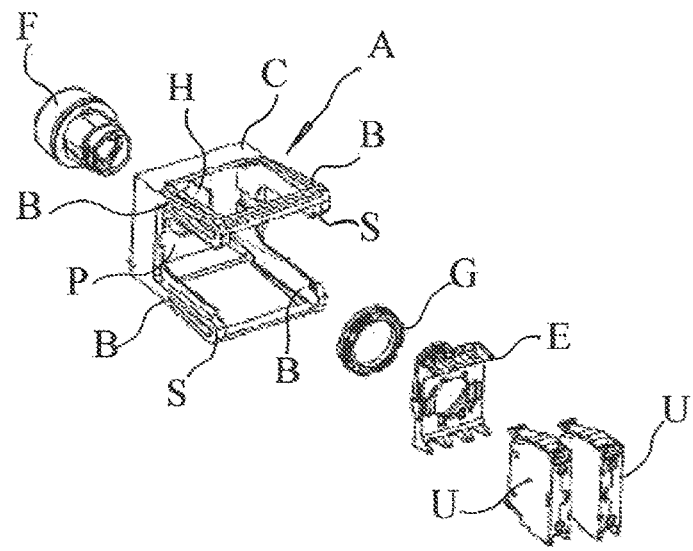
FIG. 1 – STATE OF THE ART
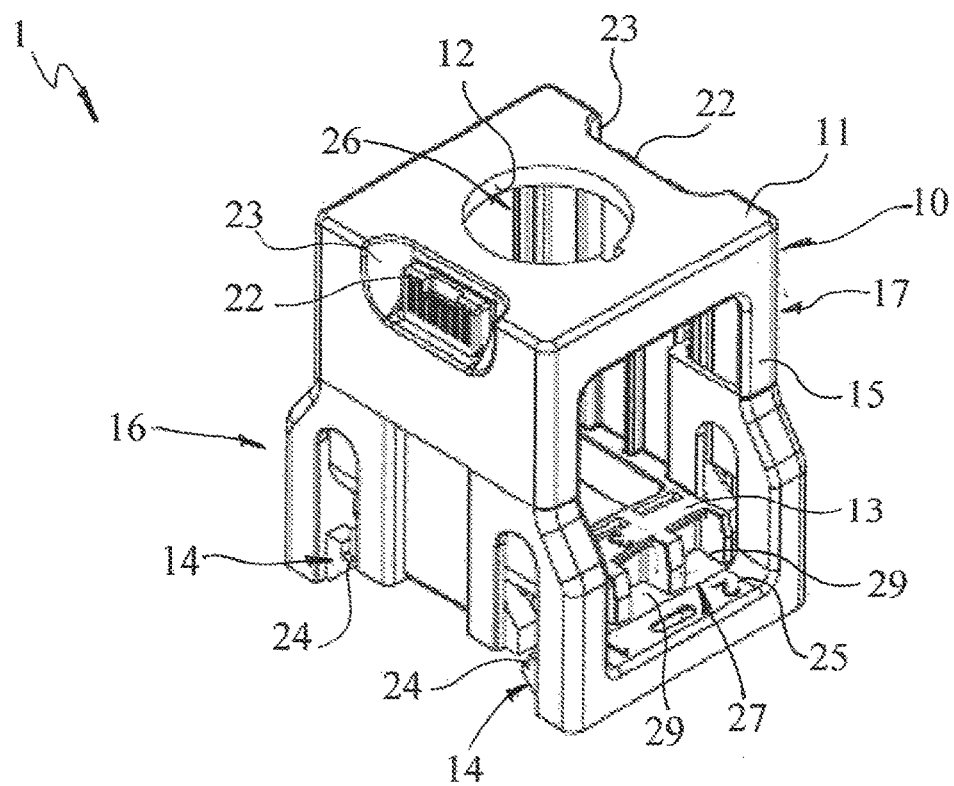
FIG. 2

ADAPTER FOR MOUNTING ELECTRIC UNITS

TECHNICAL FIELD

The present invention finds application in the field of electrical devices and in particular relates with an adapter for mounting electrical units, such as contact units and/or LED units, to supports such as rods, rails and/or support panels.

STATE OF THE ART

As known, the adapters for mounting electrical contact units and/or electrical LED units to support elements such as bars, rails and panels have as main object to allow the anchoring of one or more units in a simple and fast and possibly modular manner, without having to provide specific couplings for each contact unit.

In this way it is also possible to simplify either wiring operations of the contact units or LED units to the electrical system to be checked and the connection of the contact units to a command button, a selector or other actuator appropriately provided.

Not least, they also simplify any dismantling and replacement of electrical units or other parts thereof.

From U.S. Pat. No. 5,602,363 it is known a device for mounting electronic control devices, such as relays and potentiometers, on a DIN rail, which device comprises a box formed by a bottom wall externally provided with attachment means to the bar and internally with means for positioning a support formed by a bottom wall and two side walls designed to support both the electrical device and an operating selector of such electric device.

The assembly of these parts is totally closed by an upper lid also having a hole for the access to the selector.

Such a mounting device, in addition to being particularly complex and therefore also relatively expensive, has a somewhat limited and poorly modular application, not suitable for typical contact or LED units.

Moreover, the anchoring of the electronic device inside the box is achieved through a series of elements which couple from one side to the bottom wall and on the other to the lid. In particular, the device requires the presence of a motherboard that rests on the bottom wall and a series of side blocks which are coupled on one side to the motherboard and at the other side are inserted in the slots of the lid so that when the lid is snap coupled on the bottom wall the locking of the electronic device is also obtained.

Consequently the mounting device has a very complex assembly, and moreover its use is limited by the fact that the removal of the lid also causes the decoupling of the electronic device from the bottom wall and then from the bar.

Therefore, this solution is not suitable for fixing several control units because, when replacing only one of the contact units is needed, or even only the command button, it is necessary to provide the disassembly of the whole device.

DE202006006615 discloses an adapter for mounting of electronic cards to a DIN bar that presents the same drawbacks described above and is not suitable to be used with contact units. An example of an adapter for mounting a contact unit to DIN bars present on the market is the adapter of the Pegasus series, shown in FIG. 1, produced and marketed by Giovenzana International B.V.

The adapter A is constituted by an anchoring body C in a single piece of substantially cubic shape with a top panel P from which four arms B extend rearwardly and are provided at their free ends with respective slots S for coupling to a bar of the DIN type.

The top panel P is instead provided with a hole H for the passage of the command button F and its connection to one or more contact units U by means of an interface element E and a ring nut G housed within the same body C.

A further example of adapter, which can be used both with DIN bars that for mounting on support plates, is disclosed in EP1173910. This adapter differs from that described above essentially by the fact that at its open bottom wall, the cubic anchoring body is provided both with coupling means for mounting on a DIN rail and of screw connection means for mounting on support plates.

The main drawback of these solutions is due to the fact that the wiring of the contact units is made difficult by the need to run cables through the box-like body of the adapter. This difficulty is even greater in the case where the adapter is already mounted on the support.

Furthermore, after assembling the assembly consisting of adapter, contact units and button, a limited space remains for its mounting to the support, also because of the little space available in correspondence of the side openings.

Further, in case it is necessary to replace one of the contact units or even only the command button, it is necessary to provide the disassembly of the whole assembly.

Not least, these known solutions are adapted to be used only with contact units provided for coupling with the panel, i.e. arranged to engage the top wall of the box-shaped body, and not with contact units with coupling to the bottom of the box.

An example of an adapter for mounting contact units to DIN bars, similar to that described above, but usable with contact units with a coupling to the bottom of the box is instead produced and marketed by ABB.

This known adapter consists essentially of a substantially cubic box-shaped body completely open at the bottom and configured to be attached directly to the contact units and not to the bar.

The contact units have means for coupling to the bottom so as to be able to attach directly to the bar.

Also in this case, the box-shaped body of the adapter is provided with a hole for the passage of a button or other command adapted to be fixed to the box-shaped body by means of a ring nut to interact with the contact unit.

The main drawback of this solution consists in that the assembly consisting of adapter and contact unit is unstable and with limited resistance due to the fact that the adapter is mounted directly on the contact unit.

It also follows that in the event that it is necessary to use a single unit of contact, it is necessary to arrange a fictitious contact unit in order to allow the coupling of the adapter.

SCOPE OF THE INVENTION

The object of the present invention is to overcome the above drawbacks, realizing an adapter for mounting electrical units, such as contact and/or LEDs units, which presents high efficiency and relative cheapness.

A particular object is to provide an adapter for mounting electrical units, which allows simple and rapid wiring of the units to electrical systems to be controlled.

Still another object is to provide an adapter for mounting electrical units that can be coupled in an easy and fast manner to the support for which it is designed, such as a bar, a rail, for example of the DIN or mini-DIN type, a panel or the like.

A further object is to provide an adapter for mounting electrical units that allows the removal and/or replacement of the electrical units and/or of the command buttons in a simple and fast way, without requiring complete disassembly of the adapter.

Another object of the present invention is to provide an adapter for mounting electrical units that may be used with contact units or LED units provided for coupling either with a panel or with the bottom of a box.

These objects, as well as others which will appear more clearly hereinafter, are achieved by an adapter for mounting electrical units, in particular contact units or LED units, which according to claim 1 comprises a substantially box-like and internally hollow anchoring body for housing at least one electrical unit thereinside.

The anchoring body has an upper portion with an upper face provided with a hole for the passage of a command for driving of one or more electrical units, a lower portion removably coupled to said upper portion and having a bottom wall, a pair of mutually opposed side faces at least partially open to allow access of the wires to the at least one electrical unit housed in said anchoring body, means for removably mounting said anchoring body to a support which are associated with said lower portion, first holding means adapted to removably fixing at least one electrical unit to said bottom wall.

The first holding means are firmly associated with said bottom wall and comprise at least one first and one second recess formed in said bottom wall at respective open side faces and adapted for receiving and snap coupling with the electrical unit to anchor it to said lower portion even in the absence of said upper portion.

Thanks to this combination of features the wiring of the electric units, both contact units or LED units, can be carried out in an easy manner as it will be possible to remove one of the two portions, keeping the one or more electrical units coupled to the other portion and possibly already mounted on the support.

Similarly, when it will be necessary to remove and possibly replace one or more of the electrical units, it will not be necessary to provide for the disassembly of the whole adapter and its removal from the support.

On the contrary, it will be possible to limit to the removal of the upper portion, leaving the lower portion mounted on the support and possibly connected to the electrical units.

Advantageously, said anchoring body may include first holding means adapted to removably fixing at least one electrical unit to said bottom wall and a second holding means for removably fixing at least one electric unit to said upper face.

In this way, the adapter may be used both with electric units, such as contact and/or LEDs units, designed for attachment to the bottom of the box and with electrical units designed for coupling to a panel.

Suitably, said second holding means may comprise a connecting plate which can be snap-coupled with one or more electrical units in mutually side-by-side positions and parallel to each other and having a passage adapted to be aligned with said hole of said upper face to allow interaction between the electrical units and the control button.

In addition, said connecting plate may include a rotatable unlocking element for rotating between a locking position of the control button on said plate and a release position, said unlocking element comprising a driving portion accessible through one of said side open faces.

In this way, if the control button has to be replaced it will be sufficient to provide for its unlocking from the connecting plate and for the subsequent removing from the upper portion.

In the case where the electrical units couple to the bottom of the box, the replacement of the control will be equally simple as it will be sufficient to remove the upper portion of the body, to which the control may be anchored by means of a fixing ring nut, and subsequently to remove the ring nut to make the control free.

Advantageously, said lower portion and said upper portion may comprise respective first mutual and removable coupling means of the male and female type that will simplify their coupling.

Moreover, said lower portion and said upper portion may also comprise second snap coupling means which will ensure the stability of the coupling but at the same time become easily disengageable.

Advantageous embodiments of the invention are obtained according to the dependent claims.

BRIEF DESCRIPTION OF THE DRAWINGS

Further features and advantages of the invention will become more apparent in light of the detailed description of a preferred but not exclusive embodiment of the adapter for mounting electric units, illustrated by way of non-limiting example with the aid of the accompanying drawing, in which:

FIG. 1 is an exploded perspective view of an adapter according to the state of the art;

FIG. 2 is a perspective view of an adapter according to the invention;

BEST MODES OF CARRYING OUT THE INVENTION

Figures 3, 4:
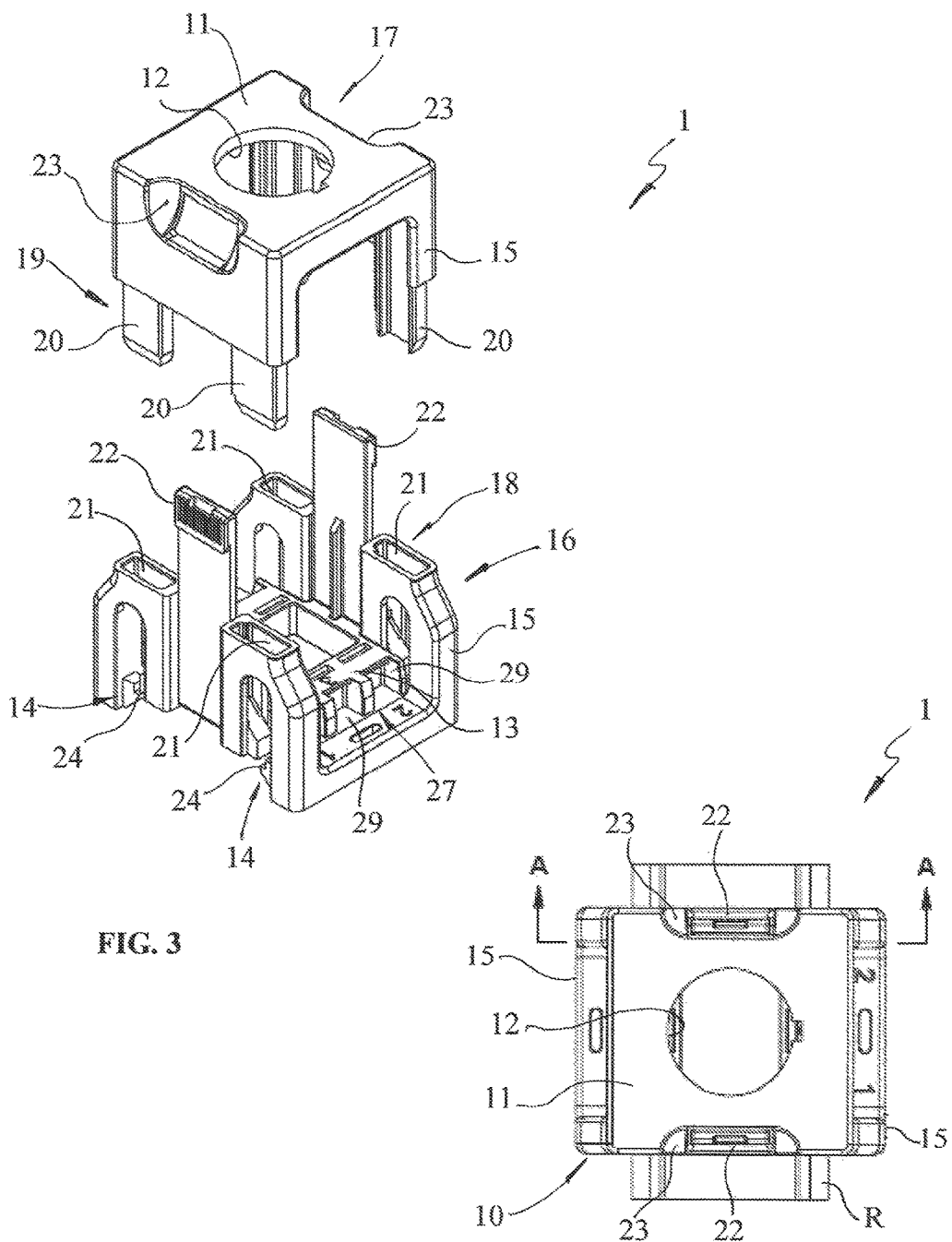
FIG. 3 is an exploded perspective view of the adapter of FIG. 2.
FIG. 4 is an elevated view of the adapted of FIG. 2 mounted on a bar.

With reference to the attached figures a preferred but not exclusive embodiment of an adapter for mounting one or more electrical units to a support is shown.

In particular in the figures, the adapter, generally indicated by 1, is illustrated in two different operative embodiments, in which it is associated with contact units of the type with so-called panel-coupling and with contact units and LEDs unit of the type with so-called bottom box-coupling.

The adapter 1 of the figures is also designed to be mounted on a rod or support rail R that in a non-limiting example may be a bar according to the DIN standard.

However, the adapter 1 can be easily modified to be mounted also on different types of supports, such as mini DIN bars or panels, without departing from the scope of the present invention.

The electrical units, contact units and LED units, generally indicated with 2, will be of the known type and commonly available on the market, with a case 3 which houses thereinside switching means, not shown, adapted to be connected to one or more electrical systems to be controlled by wiring with one or more wires, also not shown, to be inserted into respective terminals 4 electrically connected to the switching means.

Always in a known manner, in the case in which the electric units 2 are contact units, the switching means will be operatively coupled to an actuator 5 projecting from the case 3 for interacting with a control button, such as a single button 6 as in the figure, or a multiple button, a selector, a mushroom emergency button or any other control device designed to be arranged externally to the adapter 1 and having the aim of varying the state of the switching means.

The button 6 generally comprise a rod 7 designed to be inserted into the adapter 1, as described more clearly hereinafter, and a knob, pommel or outer slider 8 for engaging the contact units 2.

Figure 8:
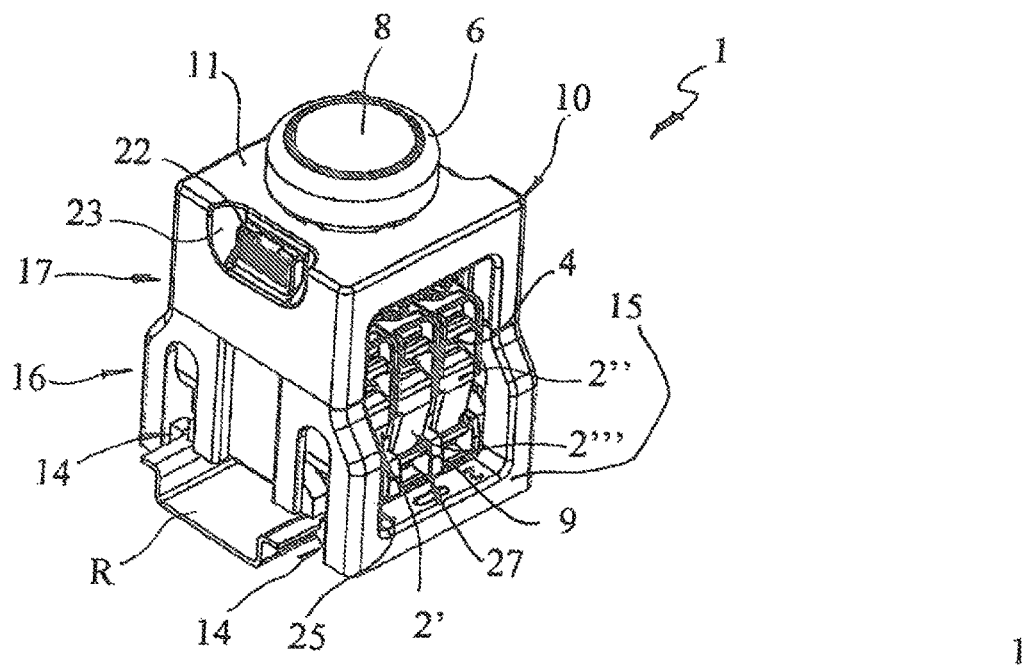
FIG. 8 is a perspective view of the adapter of FIG. 2 in a first operative condition and associated with two contact units and one LED unit with couplings to the bottom of the box.
Figure 10:
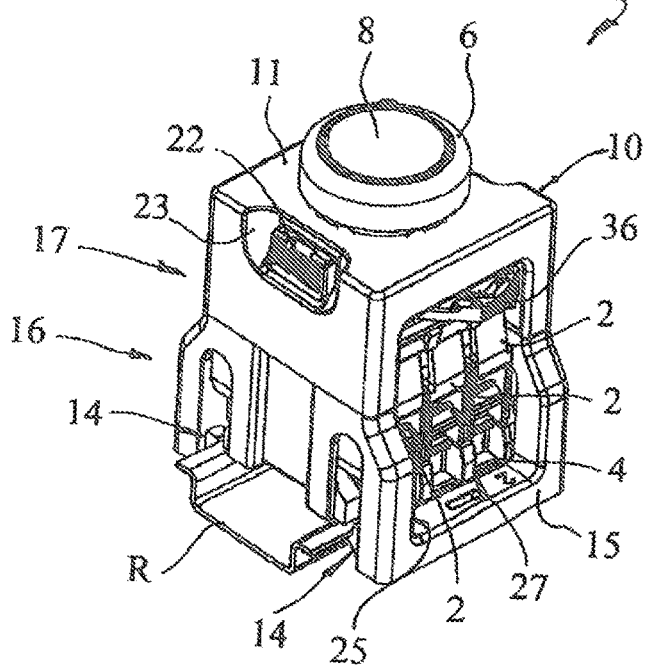
FIG. 10 is a perspective view of the adapter of FIG. 2 in a second operative condition and associated with three contact units with coupling to a panel.

Instead, if the electrical unit 2 is a LED unit it will be fitted with a upper LED light 5' in place of the actuator 5, and also the button 6 will have at least one optically transparent or translucent portion for the passage of the light emitted by the diode The electrical units 2 may be of the bottom box-coupling type, i.e is provided with coupling fins 9 or similar members at the lower face of the case 3, as shown in FIG. 8, or of the panel-coupling type, i.e provided with coupling fin 9 or similar members at the upper face of the case 3, as shown in FIG. 10.

As can be seen from FIG. 2, an adapter 1 according to the invention comprises an anchoring body 10 which is substantially box-shaped and internally hollow to house thereinside one or more electrical units 2.

The box-like anchoring body 10 has an upper face 11 provided with a hole 12 for the passage of the control button 6 to be connected to one or more of the electrical units 2, a bottom wall 13 associated with means 14 for the removable mounting of the body 10 to the selected bar R or support and a pair of side faces 15 which are mutually opposite and at least partially open to allow the access of the wires to the terminals 4 of the contact or LED units 2 housed in the anchoring body 10.

As more clearly shown in FIG. 3, the anchoring body 10 is defined by a pair of portions 16, 17 mutually coupled in a removable manner so as to be separated to allow the easy and quick insertion of the electrical units 2 and to simplify the steps of wiring and mounting the assembly to bar R or other support.

In particular, the lower portion 16 comprises the bottom wall 13 with the mounting means 14, while the upper portion 17 comprises the upper face 11 with the through hole 12.

The lower portion 16 and the upper portion 17 are made adapted to be coupled together in a removable manner by respective first mutual coupling means 18, 19.

In the shown embodiment, preferred but not exclusive, the first removable coupling means 18, 19 are of the male and female type.

In particular, the upper portion 17 includes four male elements 20 which extend downwards from the upper face 11 at the corners thereof to fit by sliding in a sized manner in corresponding female elements 21 which extend upwardly from the bottom wall 13 and which define the first coupling means 18 of the lower portion 16.

To improve the tightening of the coupling, the lower portions 16 and upper portion 17 also comprise respective second snap coupling means which, in the shown embodiment, are defined respectively by a pair of flexible side fins 22 which extend upwardly from the bottom wall 13 and by corresponding slots 23 of the upper portion 17 in which the flexible fins 22 are inserted and snap locked.

The configuration shown for the first coupling means 18, 19 and for the second coupling means 22, 23 is characterized by particular simplicity and at the same time by a good tightening of the coupling.

However, such means may also be of different type, for example of the screw and nut type or the like, provided that it remains possible to uncouple and re-couple the two portions 16, 17 in a substantially unlimited manner.

FIG. 4 shows the adapter 1 of the invention according to a top view and in the mounted condition on a bar R. The hole 12 of the upper face is a circular hole that in this configuration has a diameter of 22 mm to accommodate standard push buttons 6.

Figure 5:
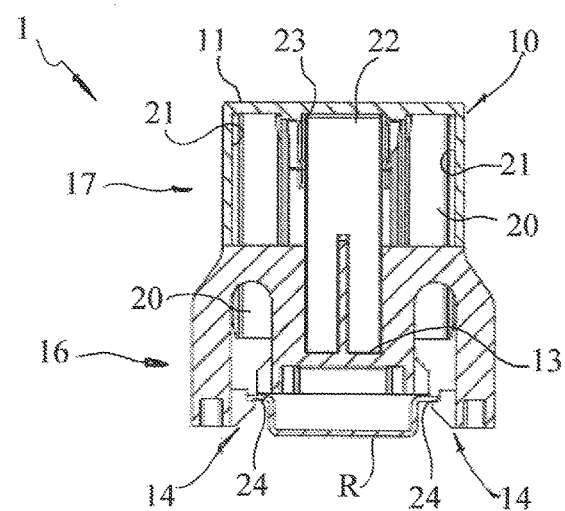
FIG. 5 is a cross sectional view of the adapter of FIG. 2 according the A-A plane of FIG. 4.
Figures 6, 7:
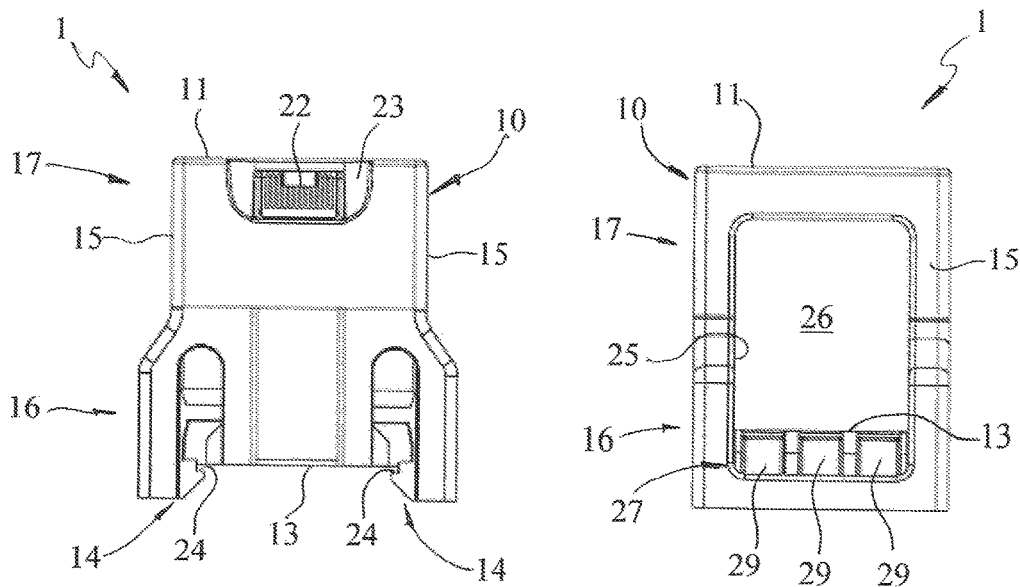
FIG. 6 is a first side view of the adapter of FIG. 2.
FIG. 7 is a second side view of the adapter of FIG. 2 90° turned with respect of FIG. 6.

In the section of FIG. 5 and in the side view of FIG. 6 it is possible to observe a preferred configuration for the mounting means 14 which will be of the snap-fit type.

In particular, the mounting means 14 comprise at least one pair of grooves 24 which extend along the bottom wall 13, inferiorly thereto and parallel to the respective open side faces 15 of the anchoring body 10, without projecting laterally from the same, to snap fitting respective longitudinal edges of the bar R.

In this way the rod R or other media will slide between the two open faces 15 and not obstruct their apertures 25 required for access to terminals 4, providing a greater maneuvering space during assembly and wiring steps and simplifying the wiring even in the case where it is carried out with the adapter 1 provided with the contact and/or LED units 2 and already mounted on the support R.

FIG. 7 shows the adapter 1 according to a side view from which it is observed that the open side faces 15 have respective openings 25 which fill up substantially their whole extension.

In this way the access to the terminals 4 will be simplified either with panel-coupling units 2, in which the terminals 4 are arranged downwards, or with bottom box-coupling units 2, in which the terminals 4 are generally arranged upwards, always in a position opposite to the anchoring fins 9.

In the assembled condition, the anchoring body 10 will define an internal seat 26 for housing one or more electrical units 2 having a height substantially corresponding to that of the electrical units 2 for which it is designed.

The electrical units 2 may thus be anchored directly to at least one of the bottom wall 13 and the upper face 11 without it being necessary to arrange additional supports, realizing an adapter 1 which is economic and with reduced overall encumbrance.

To this end, the anchoring body 10 will comprise first holding means 27 adapted to removably fixing one or more electrical units 2 to the bottom wall 13 and a second holding means 28 for removable fixing of one or more electrical units 2 to the upper face 11.

In particular, the first holding means 27 are firmly associated to the bottom wall 13, while the second holding means 28 may be removably inserted in the anchoring body 10 and used selectively and alternatively to the first holding means 27 only in the case in which the electrical units 2 are of the type with coupling to the panel.

FIG. 8 shows an adapter 1 mounted on the bar R and wherein two contact units 2', 2" with coupling to bottom of the box are positioned at the sides of a central LED unit 2''', which is also of the bottom box-coupling type.

The three electrical units 2', 2", 2''' are associated with only one control button 6 and their stable coupling to the anchoring body 10 is carried out by the first holding means 27 of the bottom wall 13, which in this configuration are of the snap fit type.

Figure 9:
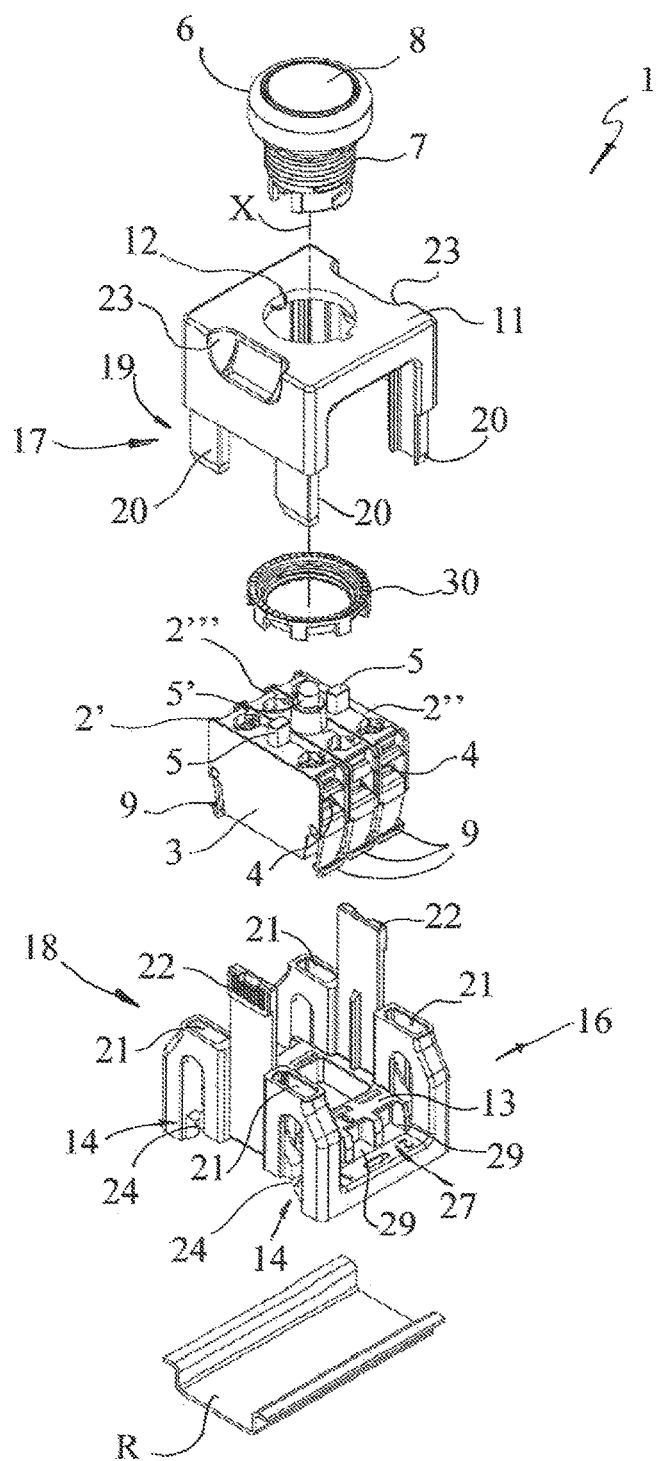
FIG. 9 is an exploded perspective view of the adapter of FIG. 8.

As more clearly visible from FIG. 9, the first holding means 27 comprise a first and a second series of recesses 29 parallel to each other and arranged at respective open side faces 15.

Each recess 29 is adapted to receive and hold a respective snap fin 9 of the contact units 2', 2" and the of the LED unit 2''' to place them in mutually side-by-side positions and parallel to each other.

In a known manner, the control button 6 has its rod 7 externally threaded to be fixed to the upper face 12 of the body 10 by means of a counterscrewed ring nut 30.

The interaction between the button 6 and the electrical units 2 will take place in a known manner, for example through the interaction of the slider 8 with the actuators 5 upon the downward pressure of the first.

The slider 8 may also be at least partly transparent or translucent to allow the passage of the light emitted by the LED diode 5'.

FIG. 10 shows the same adapter 1 associated with three contact units 2 of the panel-coupling type, which units 2 will be coupled to the upper face 11 of the body 10 by means of the second holding means 28.

Figure 11:
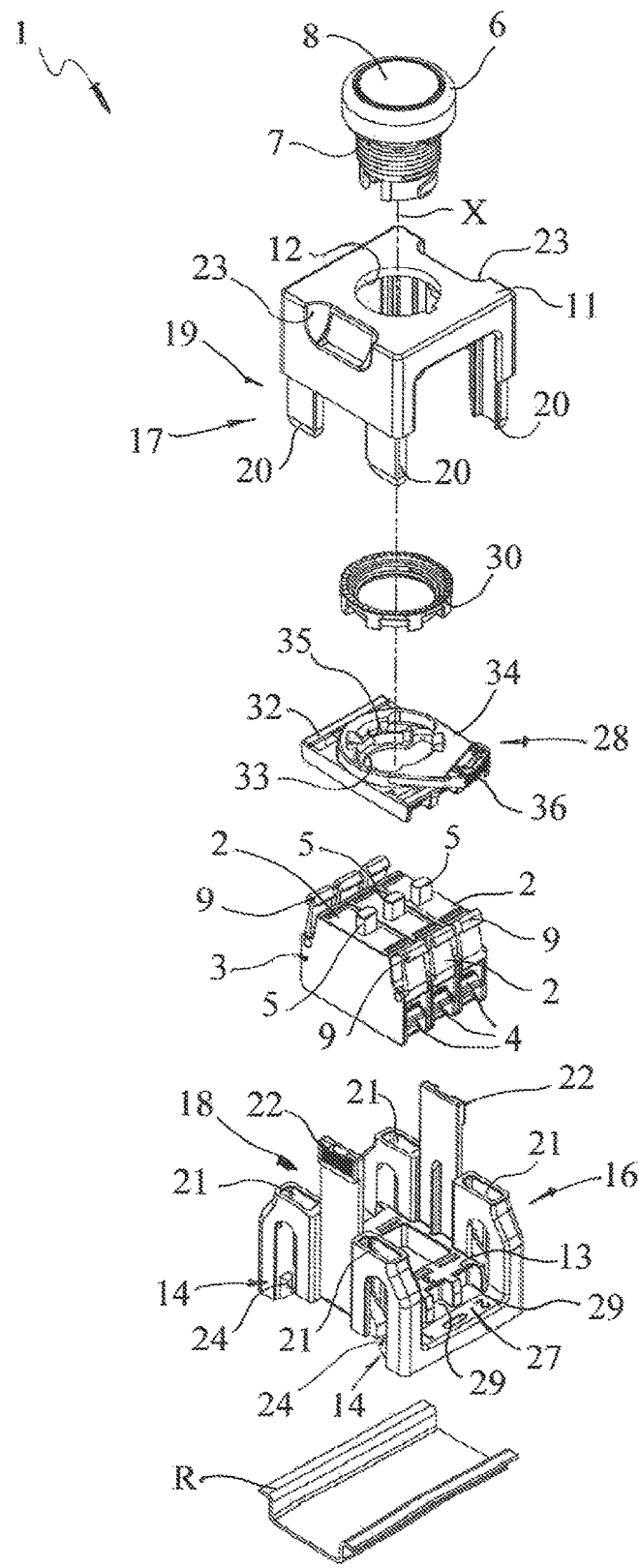
FIG. 11 is an exploded perspective view of the adapter of FIG. 10.

As visible from FIG. 11, the second holding means 28 comprise a connecting plate 32 designed to be inserted only if necessary in the housing seat 26, close to the top face 11, to be snap coupled with the upper fins 9 of the contact units 2 in mutually side-by-side positions and parallel to each other.

The connecting plate 32 will also comprise a central passage 33 which in use will be aligned with its central axis X to the hole 12 of the upper face 11 to allow interaction between the electrical units 2 and the control button 6.

The connecting plate 32 also comprises an unlocking element 34 rotatable about the central axis X of the hole 12 to rotate between a locking position of the rod 7 on the plate 32 and a release position.

In particular, the unlocking element 34 will have a central hole 35 coaxial with the passage 33 of the plate 32 for the passage of the rod 7 and to allow interaction between the slider 8 and the actuators 5.

The unlocking element 34 also comprises a driving portion 36 accessible manually through one of the open side faces 15 to promote the rotation in both directions.

From above it appears clear that the adapter according to the invention reaches the intended objects and in particular that of simplifying the operations of mounting and wiring of contact or LED units, either with connection to the panel or to the bottom of the box.

The adapter according to the invention is susceptible of numerous modifications and variations, all falling within the inventive concept expressed in the accompanying claims. All the details may be replaced with other technically equivalent elements, and the materials may be different according to requirements, without departing from the scope of the present invention.

Even if the adapter has been disclosed with particular reference to the attached figures, reference numbers used in the description and in the claims are used to improve the intelligence of the invention and do not constitute any limitation of the claimed scope.

The invention claimed is:

1. An adapter for mounting electric units, for mounting contact units and/or LED units to a support (R), wherein the adapter (1) comprises a box-like and internally hollow anchoring body (10) having:
   an upper portion (17) with an upper face (11) provided with a hole (12) for the passage of a control (6) for driving one or more electric units (2);
   a lower portion (16) removably coupled with said upper portion (17) and having a bottom wall (13);
   a pair of reciprocally opposite side faces (15) at least partially open to allow the wires access to at least one electric unit (2) housed in said anchoring body (10);
   a mounting portion (14) for removably mounting said anchoring body (10) to the support (R), the mounting portion (14) being associated with said lower portion (16);
   a first holding means (27) adapted to removably fix at least one electric unit (2) to said bottom wall (13), the at least one electric unit (2) having a case (3) which houses thereinside switching means and being provided with coupling members (9) at the lower face of the case (3);
   a second holding means (28) for removably fixing the at least one another electric unit (2) on said upper face (11), the at least one another electric unit (2) having a case (3) which houses thereinside switching means and being provided with coupling members (9) at the upper face of the case (3);
   wherein said lower portion (16) and said upper portion (17) comprise respective first coupling means (18, 19) of the male and female type for their mutual and removable coupling;
   wherein the first holding means (27) are connected to the bottom wall (13) and comprise at least one first and one second recesses (29) formed in said bottom wall (13) at respective of said open opposite side faces (15) and adapted to house and snap-hold the corresponding holding fins (9) of the respective electric unit (2) to fix it to said lower portion (16) in absence of said upper portion (17);
   wherein the second holding means (28) are removably inserted in the anchoring body (10) to be used selectively and alternatively to the first holding means (27) and are adapted to house and snap-hold the corresponding holding fins (9) of the respective electric unit (2) to fix it to said upper portion (17) in absence of said lower portion (16);
   wherein said mounting portion (14) is of the snap-fit type with at least one pair of grooves (24) extending along said bottom wall (13), under thereto and parallel to the respective open side faces (15) of said anchoring body (10), for snap fitting respective longitudinal edges of the support (R);
   wherein the open opposite side faces (15) have respective openings (25) sized for allowing direct access to all the corresponding recesses (29) to allow access to terminals (4) of the electric units (2), both when the at least one electric unit (2) is fixed to the lower portion (16) and when the at least one electric unit (2) is fixed to the upper portion (17).

2. The adapter as claimed in claim 1, wherein said first holding means (27) are of the snap-fit type.

3. The adapter as claimed in claim 2, wherein said first holding means (27) comprise two rows of first and second recesses (29) parallel to each other located for positioning a plurality of electric units (2) in side-by-side and parallel positions.

4. The adapter as claimed in claim 3, further comprising one or more contact or LED electric units (2) having a case (3) housing switching means and provided with a top actuator (5) or LED light (5') designed to be located in correspondence of said hole (12) with a pair of lower bolding fins (9) adapted to be snap-fitted in respective recesses (29) of said bottom wall (13).

5. The adapter as claimed in claim 2, further comprising one or more contact or LED electric units (2) having a case (3) housing switching means and provided with a top actuator (5) or LED light (5') designed to be located in correspondence of said hole (12) with a pair of lower holding fins (9) adapted to be snap-fitted in respective recesses (29) of said bottom wall (13).

6. The adapter as claimed in claim 1, wherein said lower portion (16) and said upper portion (17) comprise respective second coupling means (22, 23) of the snap-fit type.

7. The adapter as claimed in claim 1, wherein said second holding means (28) comprise a connecting plate (32) adapted to be inserted into said anchoring body (10) and to be coupled to the control (6), at least one of said electric units (2) having a pair of upper fins (9) adapted to be snap coupled with said connecting plate (32).

8. The adapter as claimed in claim 7, wherein said connecting plate (32) has a central passage (33) axially aligned with said hole (12) of said upper face (11) to allow the interaction between the electric units (2) and the control (6).

9. The adaper as claimed in claim 8, wherein said connecting plate (32) comprises an unlocking element (34) rotatable about a central axis (X) of said hole (12) to rotate between a locking position and a release position of the control (6) with respect of said plate (32).

10. The adapter as claimed in claim 9, wherein said unlocking element (34) comprises a handling portion (36) accessible with a hand through one of said open side faces (15) to promote the rotation between said locking and release positions.

* * * * *